United States Patent
Lu

(10) Patent No.: US 7,921,228 B2
(45) Date of Patent: Apr. 5, 2011

(54) MODULARIZED ELECTRONIC SWITCHING CONTROLLER ASSEMBLY FOR COMPUTER

(75) Inventor: Limo Lu, Taipei Hsien (TW)

(73) Assignee: Broadrack Technology Corp. (TW)

( * ) Notice: Subject to any disclaimer, the term of this patent is extended or adjusted under 35 U.S.C. 154(b) by 212 days.

(21) Appl. No.: 12/205,929

(22) Filed: Sep. 8, 2008

(65) Prior Publication Data
US 2010/0064059 A1    Mar. 11, 2010

(51) Int. Cl.
G06F 3/00        (2006.01)
G06F 13/38     (2006.01)
H05K 7/14      (2006.01)

(52) U.S. Cl. ........... 710/2; 710/62; 361/605; 361/727
(58) Field of Classification Search .................. None
See application file for complete search history.

(56) References Cited

U.S. PATENT DOCUMENTS

| | | | | |
|---|---|---|---|---|
| 6,442,031 B1* | 8/2002 | Liu | | 361/727 |
| 7,460,375 B2* | 12/2008 | Randall et al. | | 361/724 |
| 7,584,325 B2* | 9/2009 | Holland et al. | | 711/114 |
| 2002/0089820 A1* | 7/2002 | Abboud | | 361/685 |
| 2003/0161114 A1* | 8/2003 | Berry et al. | | 361/727 |
| 2004/0240185 A1* | 12/2004 | Cheng | | 361/727 |
| 2005/0177681 A1* | 8/2005 | Fujimoto et al. | | 711/112 |
| 2005/0258721 A1* | 11/2005 | Hung | | 312/223.1 |
| 2006/0220505 A1* | 10/2006 | Nakamura et al. | | 312/223.2 |
| 2007/0230106 A1* | 10/2007 | Yeh | | 361/685 |
| 2007/0240017 A1* | 10/2007 | Takahashi | | 714/14 |
| 2008/0266813 A1* | 10/2008 | Carlisi et al. | | 361/727 |
| 2009/0141457 A1* | 6/2009 | Fujikawa | | 361/727 |
| 2009/0219701 A1* | 9/2009 | Wu et al. | | 361/727 |

* cited by examiner

Primary Examiner — Henry W Tsai
Assistant Examiner — Michael Sun

(57) ABSTRACT

A modularized electronic switching controller assembly for a computer includes a computer device; a hub positioned at a rear end of the computer device; two sides of the hub unit being installed with tracks which are retained in a machine frame; the machine frame being formed by four supporting posts; a support arm connected between the computer-related assembly and the hub for receiving conductive wires; a switching controller installed at the tracks having two racks of the hub unit; a connecting surface of the switching controller having an electric connector; a rear side of the switching controller being installed with at least one connecting port; moving the switching controller through the tracks will make the switching controller entering from a rear end of the machine case; by the connection of the electric connector and the hub unit, the connecting port can be connected to external peripherals or a server.

7 Claims, 7 Drawing Sheets

MODULARIZED ELECTRONIC SWITCHING CONTROLLER ASSEMBLY FOR COMPUTER

FIELD OF THE INVENTION

The present invention relates to computer devices, and particularly to a modularized electronic switching controller assembly for a computer, wherein the switching controller is a modularized design which can be installed at a rear side of a computer to be connected to a corresponding electric connector with a simpler wiring and the assembly work is easy and only a little space is necessary.

BACKGROUND OF THE INVENTION

Other than the combination of a computer mainframe, a data accessing unit, a display, an input device, etc., the connections of the mainframe to the peripherals are also included in an industrial computer casing array. Such as a plurality of mainframes or servers, a plurality of databases, or peripherals (such as far end detection, sequential control, etc.) are connected. In this connection, a modularized electronic switch (KVM switch) is also included for switching the connection and interruption of the wire connections. Moreover, one or more mainframes can get the signals in the mainframe (of a personal computer), a server, a disk array, or a device detected or controlled. Or further, through the switching controller 30 and an Internet or Ethernet at the input or output end to be connected to a far end computer, parallel or transversal connections and transmission can be improved.

The conventional switching controller 10 (referring to FIG. 1) has a form like a single thin casing. A front end thereof has a plurality of keys 11. Interior thereof has a control circuit and a rear end thereof has corresponding I/O ports which are connected to the far end mainframe, server, disk array (not shown) through wires.

A rear end of the switching controller 30 is installed with at least one port for connecting a computer mainframe 12 or other input devices. By above mentioned structure, the user may press the key 11 of the switching controller 10 to select a far end mainframe, server, disk array, etc. Meanwhile, by the connection through the wires 15 to a hub 13 at rear side of the mainframe 12, the mainframe 12 can have the data through the wire 14 according to the key 11 pressed so as to satisfy the requirement of an industrial computer.

However the prior art switching controller has the following defects.

1. Since the switching controller has a single thin casing and is connected to a hub through conductive wires, the connection is tedious to the professional engineers. Moreover, a larger space is necessary for installation. The repair and maintenance works are time consumed. Furthermore, fixing assembly is necessary for positioning the tool on a casing.

2. Basically, the switching controller is a manual switching. It is operated by pressing. The key (general a thin film switch) is easy to destroy as it is used many times. Thus the lifetime is limited. Furthermore, the contact point is not so good as requirement.

SUMMARY OF THE INVENTION

Accordingly, the object of the present invention is to provide a modularized electronic switching controller assembly for a computer, wherein the switching controller is a modularized design which can be installed at a rear side of a computer to be connected to a corresponding electric connector with a simpler wiring and the assembly work is easy and only a little space is necessary.

A further object of the present invention is to provide a modularized electronic switching controller assembly for a computer, wherein the repair and maintenance time are reduced so that the stopping time for repair is reduced, and thus the overall effect to the whole system is decreased.

To achieve above object, the present invention provides a modularized electronic switching controller assembly for a computer, comprising: a computer device; a hub positioned at a rear end of the computer device; two sides of the hub unit being installed with tracks which are retained in a machine frame; the machine frame being formed by four supporting posts; a support arm connected between the computer-related assembly and the hub for receiving conductive wires; a switching controller installed at the tracks having two racks of the hub unit; a connecting surface of the switching controller having an electric connector; a rear side of the switching controller being installed with at least one connecting port; moving the switching controller through the tracks will make the switching controller entering from a rear end of the machine case; by the connection of the electric connector and the hub unit, the connecting port can be connected to external peripherals or a server for date communication and power transfer.

Moreover, the connection surface of the switching controller and the hub unit is installed with the electric connector; the electric connector includes a first connector and a second connector; the first connector is secured to a rear side of a hub unit and is connected to a circuit board at an inner side of the electric connector; the second connector is corresponding to the second connector; the second connector is installed at a front lateral side of the switching controller and is connected to a stub circuit at an interior of the switching controller.

The various objects and advantages of the present invention will be more readily understood from the following detailed description when read in conjunction with the appended drawing.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
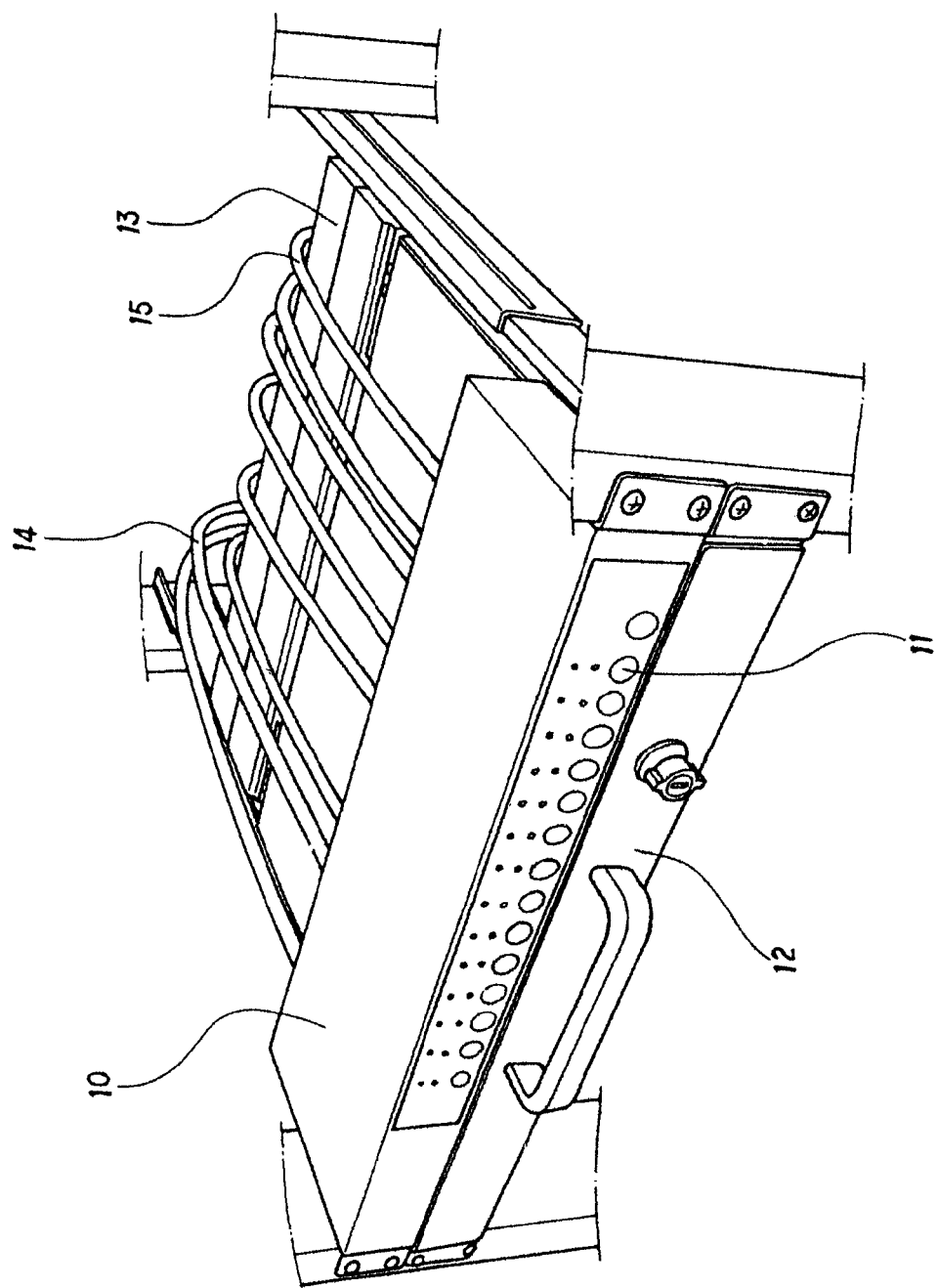
FIG. 1 is a schematic view showing the installation of a prior art computer and a switching controller.
Figure 2:
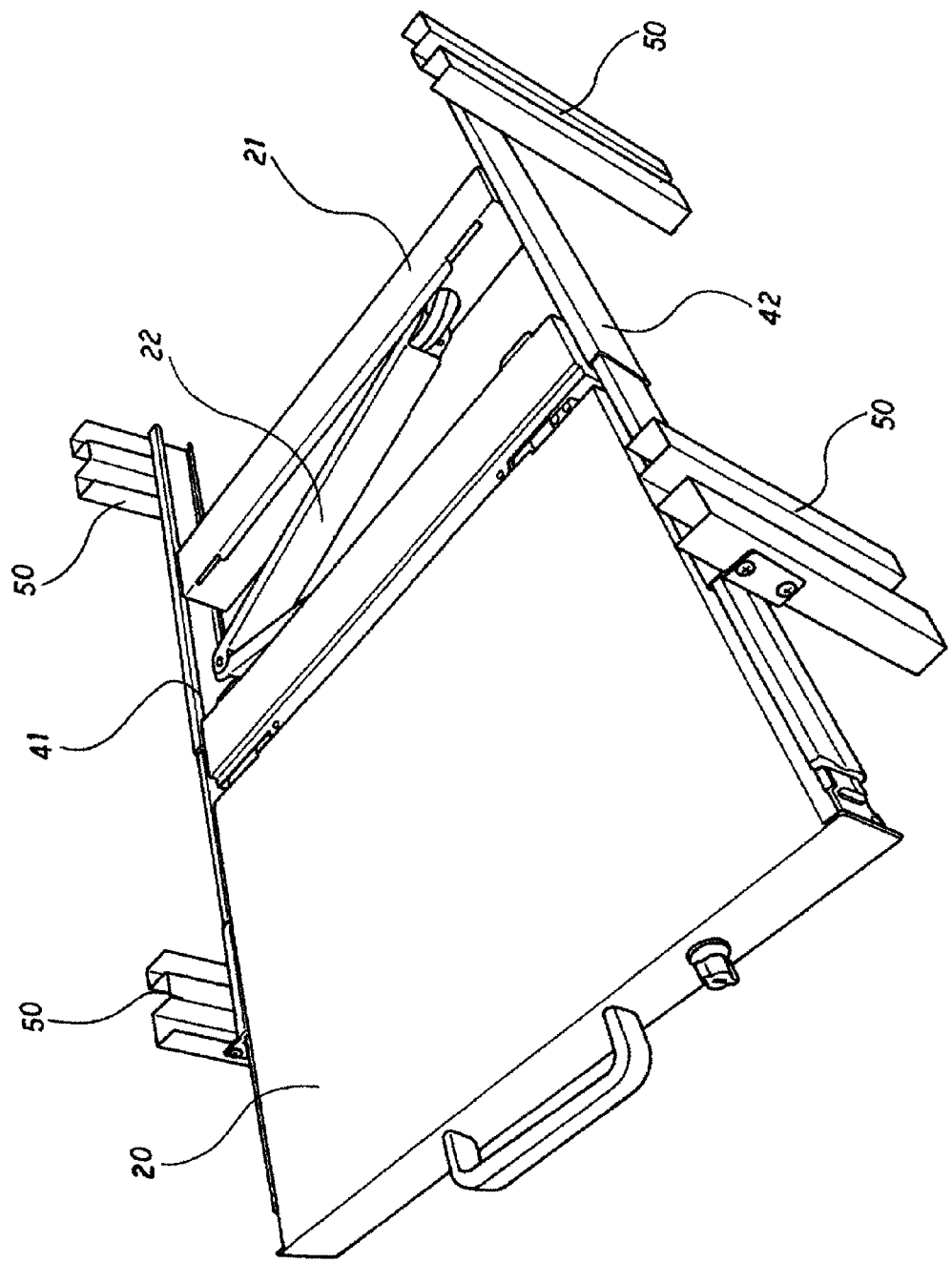
FIG. 2 is an assembled schematic view of a computer assembly and a hub unit according to the present invention.
Figure 3:
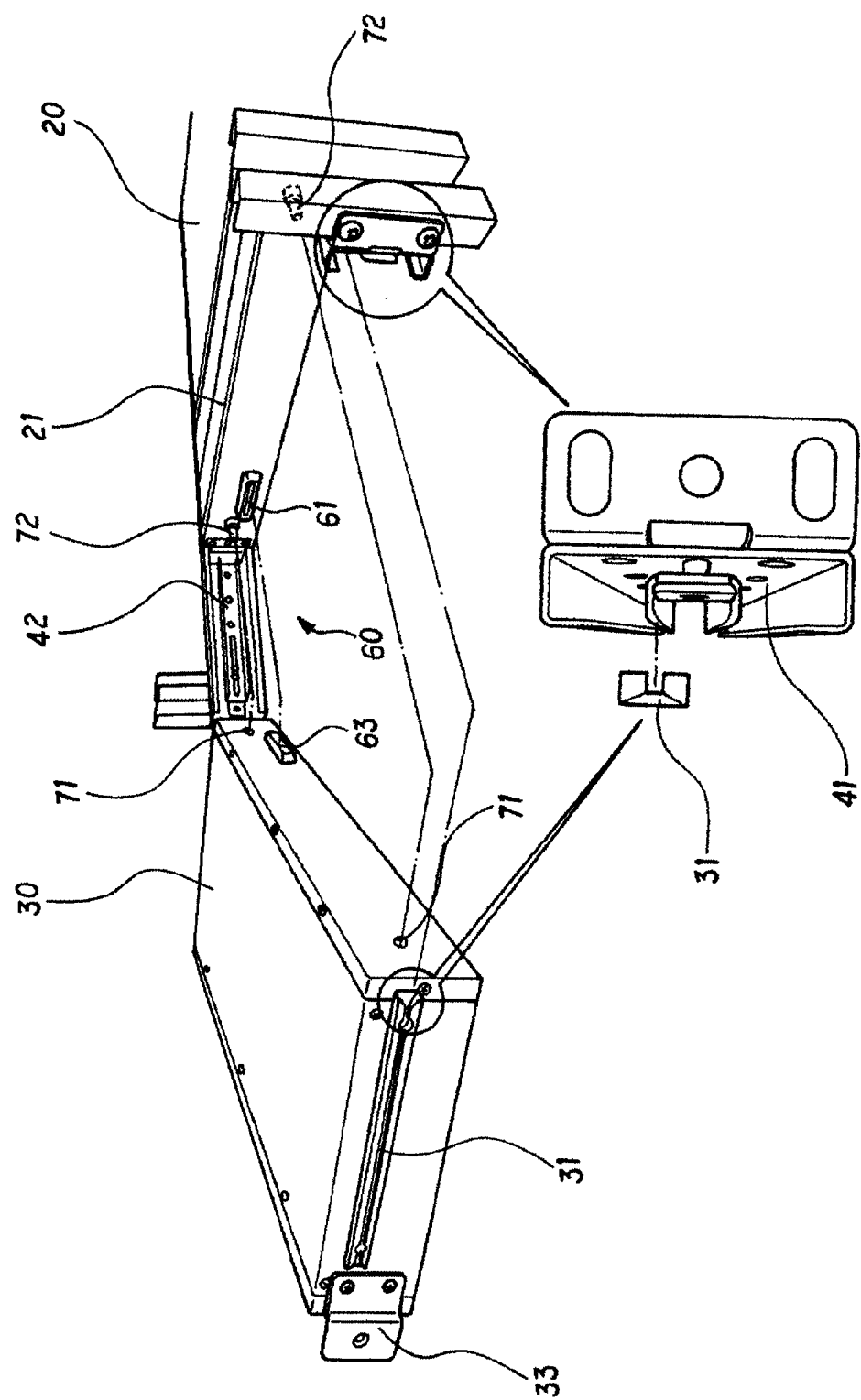
FIG. 3 is a schematic perspective view showing the assembly of the hub unit and the switching controller according to the present invention.

Referring to FIGS. 2 to 3, the positioning device for a computer-related assembly and a hub according to the present invention is illustrated.

A computer-related assembly 20 is included.

A hub 21 is positioned at a rear end of the computer-related assembly 20. Two sides of the hub unit 21 are installed with tracks 41, 42 which are retained in a machine frame. The machine frame is formed by four supporting posts 50.

A support arm 22 is connected between the computer-related assembly 20 and the hub 21 for receiving conductive wires.

Figure 5:
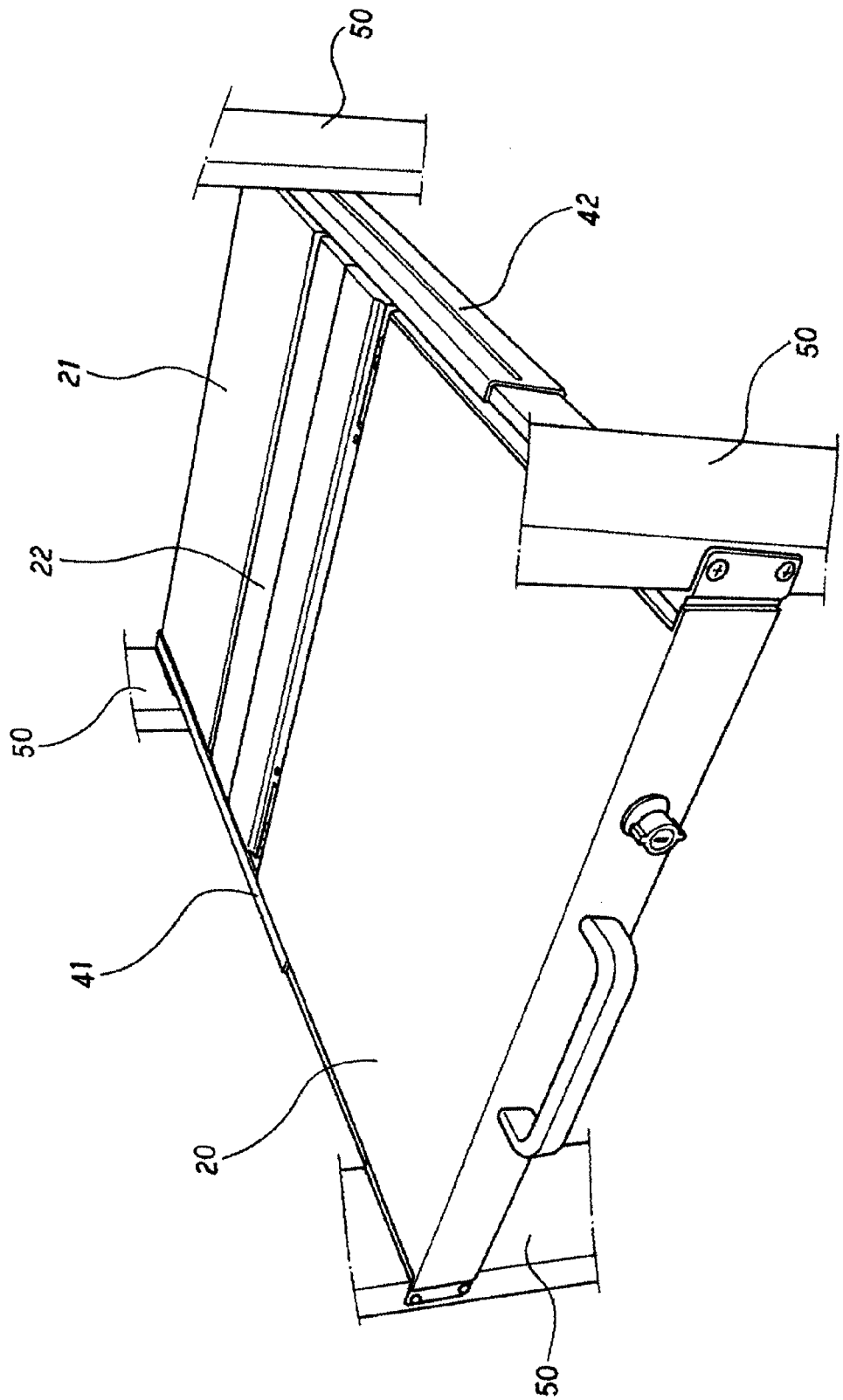
FIG. 5 is a schematic view showing that the present invention is installed within the machine case.
Figure 6:
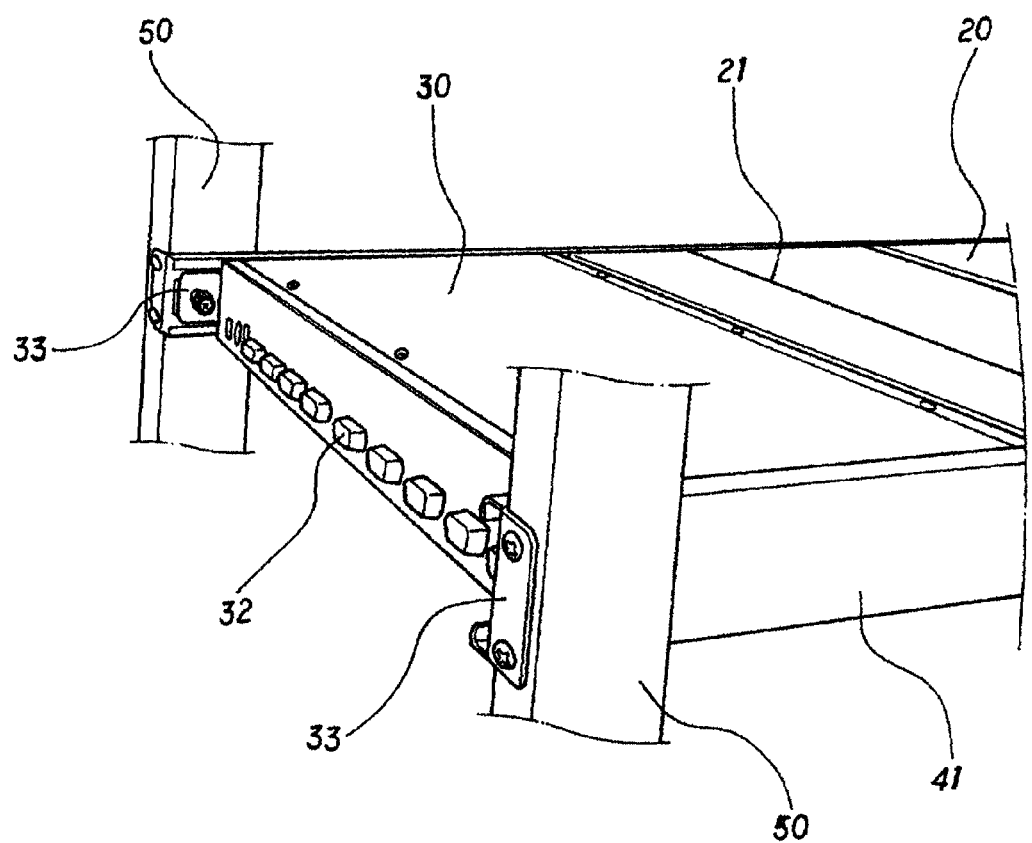
FIG. 6 is a rear view of the present invention.

A switching controller 30 has two racks 31 at two sides thereof which are slideably engaged with the tracks 41, 42 at two sides of the hub unit 21 so that the switching controller 30 is attached to the tracks. A connecting surface of the switching controller 30 has an electric connector 60 (it will be described hereinafter). A rear side of the switching controller 30 is installed with at least one connecting port 32 (referring to FIGS. 5 and 6). Moving the switching controller 30 through the tracks 41, 42 will make the switching controller 30 enter from a rear end of the machine case. By the connection of the electric connector 60 and the hub unit 21, the connecting port 32 can be connected to external peripherals or a server (not shown) for date communication and power transfer. Further, each of two rear sides of the switching controller 30 has an ear 33 which is locked to the machine case for positioning the switching controller 30.

Figure 4:
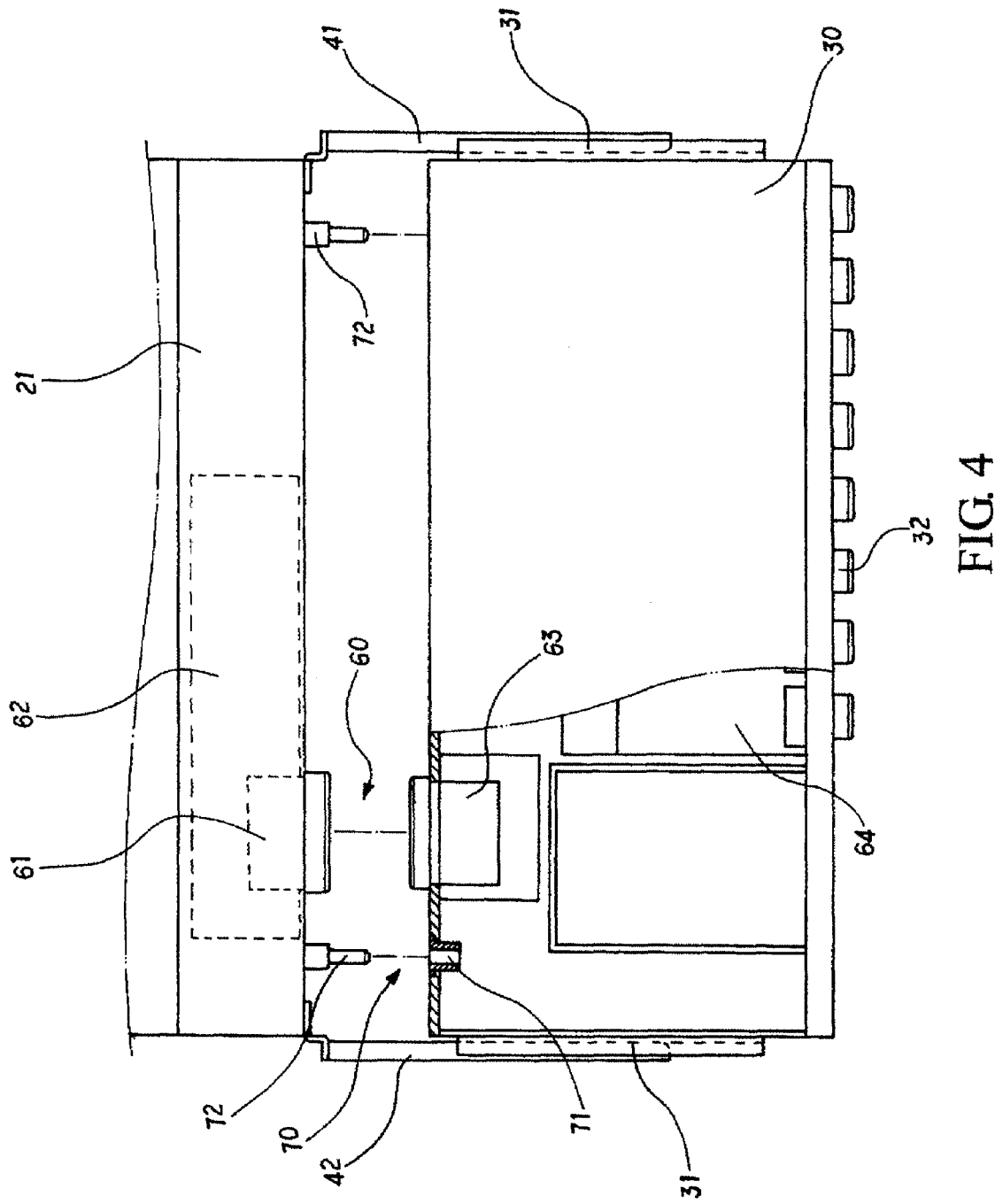
FIG. 4 is a schematic view showing the connection of the electric connector according to the present invention.
Figure 4A:
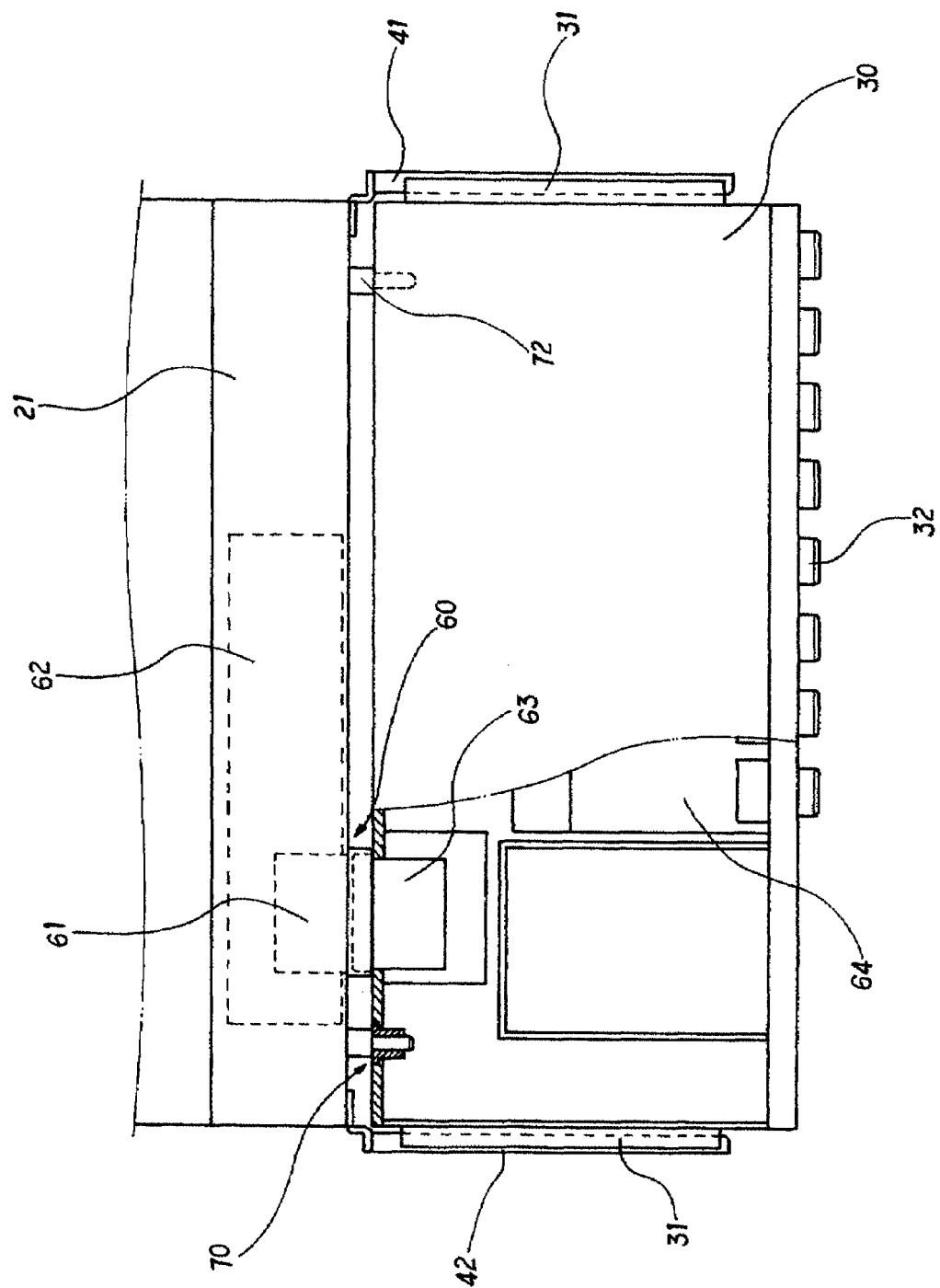
FIG. 4a shows the connection operation of the electric connector according to the present invention.

Furthermore, Referring to FIGS. 4 and 4A, the connection surface of the switching controller 30 and the hub unit 21 is installed with an electric connector 60. The electric connector 60 includes a first connector 61 and a second connector 63. The first connector 61 is suitable for being connected to the peripheral of a computer device and may be a male connector or a female connector. The first connector 61 is secured to a rear side of a hub unit 21 and is connected to a circuit board 62 at an inner side of the electric connector 60. The second connector 63 is corresponding to the second connector 63 and may be a female connector or a male connector. The second connector 63 is installed at a front lateral side of the switching controller 30 and is connected to a stub circuit 34 at an interior of the switching controller 30.

Moreover, the connecting surface of the switching controller 30 to the hub unit 21 has a positioning circuit 70 for guiding the connection of the switching controller 30 and the hub unit 21. The positioning circuit 70 includes a slot 71 at a surface connecting to the switching controller 30 and a post 72 installed at the connecting surface to the hub unit 21.

By above mentioned structure, the connecting of the switching controller 30 to the hub unit 21 can be guided and they are combined firmly and concretely.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A modularized electronic switching controller assembly for a computer, comprising:

a computer device;

a hub unit coplanarly positioned at a rear end of the computer device; two sides of the hub unit being installed with sliding tracks which are retained in a machine frame;

the machine frame being formed by four supporting posts;

a retractable support arm connected between the computer device and the hub unit for allowing the computer device to be linearly slidable relative to the hub unit; and a switching controller installed at the sliding tracks of the hub unit, coplanarly and separably connected to the hub unit; a connecting surface of the switching controller having an electric connector; a rear side of the switching controller being installed with at least one connecting port; wherein the computer device, the hub unit and the switching controller are coplanar; moving the switching controller through the sliding tracks will make the switching controller entering from a rear end of the machine case; by the connection of the electric connector and the hub unit, the connecting port can be connected to external peripherals or a server for data communication and power transfer.

2. The modularized electronic switching controller assembly for a computer as claimed in claim 1, wherein the connection surface of the switching controller and the hub unit is installed with the electric connector, the electric connector includes a first connector and a second connector; the first connector is secured to a rear side of a hub unit and is connected to a circuit board at an inner side of the electric connector; the second connector is corresponding to the second connector; the second connector is installed at a front lateral side of the switching controller and is connected to a stub circuit at an interior of the switching controller.

3. The modularized electronic switching controller assembly for a computer as claimed in claim 2, wherein the first connector is suitable for being connected to the peripheral of a computer device and is a male connector or a female connector.

4. The modularized electronic switching controller assembly for a computer as claimed in claim.2, wherein the second connector is a female connector or a male connector corresponding to the first connector.

5. The modularized electronic switching controller assembly for a computer as claimed in claim 1, wherein switching controller has two racks at two sides thereof which are slideably engaged with the sliding tracks at two sides of the hub unit so that the switching controller is attached to the sliding tracks.

6. The modularized electronic switching controller assembly for a computer as claimed in claim 1, wherein the connection surface of the switching controller and the hub unit has an electric connector and a positioning circuit for guiding the connection of the switching controller and the hub unit.

7. The modularized electronic switching controller assembly for a computer as claimed in claim 5, wherein the positioning circuit includes a slot at a surface connecting to the switching controller and a post installed at the connecting surface to the hub unit.

* * * * *